United States Patent
Liu et al.

(10) Patent No.: US 10,134,903 B2
(45) Date of Patent: Nov. 20, 2018

(54) VERTICAL SLIT TRANSISTOR WITH OPTIMIZED AC PERFORMANCE

(71) Applicants: STMICROELECTRONICS, INC., Coppell, TX (US); GLOBALFOUNDRIES Inc., Ugland House, Grand Cayman (KY); INTERNATIONAL BUSINESS MACHINES CORPORATION, Armonk, NY (US)

(72) Inventors: Qing Liu, Irvine, CA (US); Xiuyu Cai, Niskayuna, NY (US); Chun-chen Yeh, Clifton Park, NY (US); Ruilong Xie, Schenectady, NY (US)

(73) Assignees: STMICROELECTRONICS, INC., Coppell, TX (US); GLOBALFOUNDRIES INC., Grand Cayman Islands (KY); INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/343,021

(22) Filed: Nov. 3, 2016

(65) Prior Publication Data
US 2017/0077306 A1 Mar. 16, 2017

Related U.S. Application Data

(62) Division of application No. 14/588,318, filed on Dec. 31, 2014, now Pat. No. 9,515,180.

(51) Int. Cl.
*H01L 29/78* (2006.01)
*H01L 29/66* (2006.01)
(Continued)

(52) U.S. Cl.
CPC ........ *H01L 29/7855* (2013.01); *H01L 21/266* (2013.01); *H01L 21/26513* (2013.01);
(Continued)

(58) Field of Classification Search
CPC ........... H01L 27/2454; H01L 29/66666; H01L 45/1608; H01L 45/1233; H01L 29/42356; H01L 29/0847
See application file for complete search history.

(56) References Cited

U.S. PATENT DOCUMENTS

| | | |
|---|---|---|
| 2005/0145932 A1 | 7/2005 | Park et al. |
| 2005/0191795 A1 | 9/2005 | Chidambarrao et al. |

(Continued)

OTHER PUBLICATIONS

Pfitzner, "Vertical-Slit Field-Effect Transistor (VeSFET)—Design Space Exploration and DC Model," *18th International Conference on Mixed Design of Integrated Circuits and Systems*, Department of Microelectronics & Computer Science, Technical University of Lodz, Gliwice, Poland, Jun. 16-18, 2011, pp. 151-156. (7 pages).

*Primary Examiner* — Dung Le
(74) *Attorney, Agent, or Firm* — Seed IP Law Group LLP

(57) ABSTRACT

A method forms a vertical slit transistor includes raised source, drain, and channel regions in a semiconductor substrate. Two gate electrodes are formed adjacent respective sidewalls of the semiconductor substrate. The method forms dielectric material separating the gate electrodes from the source and drain regions.

20 Claims, 20 Drawing Sheets

(51) Int. Cl.
*H01L 29/423* (2006.01)
*H01L 29/51* (2006.01)
*H01L 21/265* (2006.01)
*H01L 21/266* (2006.01)
*H01L 21/28* (2006.01)
*H01L 29/06* (2006.01)
*H01L 29/417* (2006.01)

(52) U.S. Cl.
CPC .... *H01L 21/28141* (2013.01); *H01L 29/0653* (2013.01); *H01L 29/0657* (2013.01); *H01L 29/41783* (2013.01); *H01L 29/4236* (2013.01); *H01L 29/42356* (2013.01); *H01L 29/51* (2013.01); *H01L 29/518* (2013.01); *H01L 29/66484* (2013.01); *H01L 29/66787* (2013.01); *H01L 29/66795* (2013.01); *H01L 29/785* (2013.01); *H01L 29/7831* (2013.01); *H01L 29/66818* (2013.01)

(56) References Cited

U.S. PATENT DOCUMENTS

| | | | |
|---|---|---|---|
| 2006/0088967 A1* | 4/2006 | Hsiao | H01L 29/66795 438/296 |
| 2007/0096196 A1 | 5/2007 | Hofmann et al. | |
| 2007/0132009 A1 | 6/2007 | Takeuchi et al. | |
| 2010/0327363 A1 | 12/2010 | Nakabayashi | |
| 2011/0198676 A1 | 8/2011 | Luo et al. | |
| 2011/0291188 A1* | 12/2011 | Cheng | H01L 29/785 257/347 |
| 2014/0291616 A1 | 10/2014 | Park et al. | |
| 2015/0340292 A1* | 11/2015 | Dong | H01L 21/823821 438/199 |
| 2015/0372058 A1 | 12/2015 | Park | |
| 2015/0380438 A1* | 12/2015 | Chudzik | H01L 27/1207 257/350 |
| 2015/0380489 A1* | 12/2015 | Chan | H01L 27/0886 257/192 |

* cited by examiner

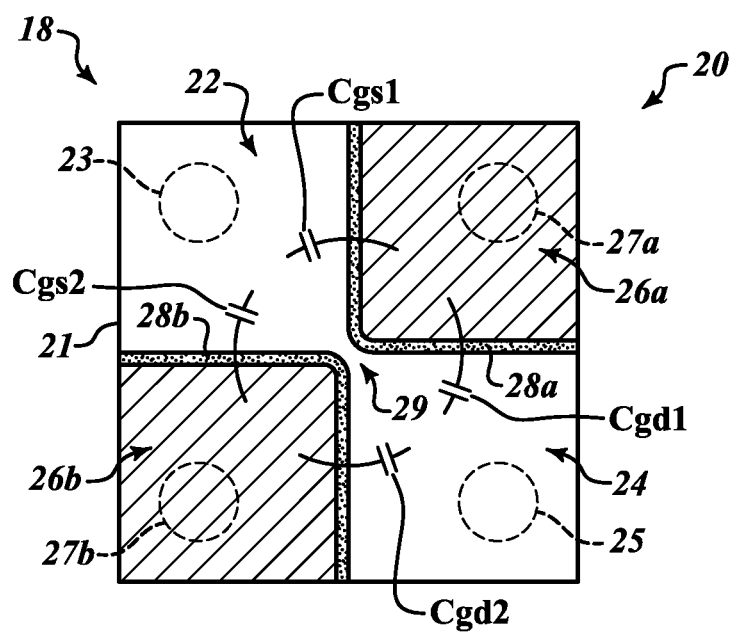
FIG. 1 *(Prior Art)*

VERTICAL SLIT TRANSISTOR WITH OPTIMIZED AC PERFORMANCE

CROSS-REFERENCE TO RELATED APPLICATION

This application is a divisional application of Ser. No. 14/588,318 filed Dec. 31, 2014, now U.S. Pat. No. 9,515,180, which application is hereby incorporated by reference in its entirety.

JOINT RESEARCH AGREEMENT

The subject matter claimed herein was made as a result of activities undertaken within the scope of a joint research agreement. The parties to the joint research agreement are (1) STMicroelectronics, Inc., (2) International Business Machines Corporation, and (3) GlobalFoundries Inc.

BACKGROUND

Technical Field

The present disclosure relates to the field of transistor designs. The present disclosure relates more particularly to the field of vertical slit transistors formed in an integrated circuit die.

Description of the Related Art

The transistor is a fundamental component of semiconductor integrated circuits. A single integrated circuit die can include billions of transistors. In order to decrease the cost, integrated circuit technology is continually scaling downward. In particular, the dimensions of the transistors are decreased in order to fit more transistors in a given area of a semiconductor substrate.

Conventional transistors typically include a source, drain, and channel region formed in a semiconductor substrate. A thin gate dielectric is positioned over the channel region. A gate electrode is positioned on top of the gate dielectric. Such conventional transistors have been the primary transistors in CMOS devices for decades.

In addition to such conventional transistors, other transistor designs have been devised. Such transistor designs include FinFET transistors, carbon nanotube transistors, and vertical slit transistors. These alternative transistor designs have been devised in order to further increase the number of transistors that can be placed in a given area of a semiconductor or other substrate.

An example of a known vertical slit transistor is disclosed in FIG. 1. In particular, FIG. 1 is a top view of an integrated circuit die 18 including a vertical slit transistor 20. The vertical slit transistor 20 includes a source region 22, a drain region 24, and a channel region 29 each positioned in a semiconductor substrate 21. The vertical slit transistor 20 further includes a first gate electrode 26a and a second gate electrode 26b positioned in a recess in the semiconductor substrate 21. The first gate dielectric 28a is positioned between the gate electrode 26a and the source 22, the drain 24, and the channel region 29. The second gate dielectric 28b is positioned between the second gate electrode 26b and the source 22, the drain 24, and the channel region 29. The top surfaces of the semiconductor substrate 21, the gate electrode 26a, the gate electrode 26b, and the gate dielectrics 28a, 28b are planar. The dashed circle 23 denotes an area in which a source contact contacts the source region 22. The dashed region 25 denotes an area at which a drain contact contacts the drain region 24. The dashed circles 27a, 27b denote respective gate contact regions for the gate electrodes 26a, 26b.

The semiconductor substrate 21 is, for example, monocrystalline silicon. The gate electrodes 26a, 26b are, for example, polysilicon or metal. The gate dielectrics 28a, 28b are a high K dielectric material such as hafnium oxide. The gate dielectrics 28a, 28b are, for example, 2-10 nm thick.

The vertical slit transistor 20 can act as a switch much like a conventional CMOS transistor. When the transistor 20 is turned on, a drain current flows from the drain 24 to the source 22. When the transistor is turned off, substantially no current flows from the drain 24 to the source 22. The transistor 20 can be either an N-channel device or P-channel device. In an example in which the transistor 20 is an N-channel device, the source region 22 and the drain region 24 are doped with N-type donor atoms. When a positive voltage is applied between the drain 24 and the source 22, the transistor can be turned on by applying a positive voltage to the gate electrodes 26a, 26b with respect to the source 22. The transistor 20 can be turned off by applying a low voltage to the gate electrodes 26a, 26b. The presence of two gates 26a, 26b adjacent to the channel region 29 allows for very rapid and strong inversion of the channel region 29, giving the transistor 20 a relatively large drain current when the transistor 20 is turned on. Likewise, the presence of two gate electrodes 26a, 26b adjacent to the channel region 29 allows for the transistor 20 to effectively stop any current from flowing between the drain 24 and the source 22.

However, the vertical slit transistor 20 also suffers from some drawbacks. For example, the vertical slit transistor 20 has relatively high capacitances between the gate electrodes 26a, 26b and the source and drain regions 22, 24. This is problematic because as the gate-to-source and gate-to-drain capacitances of a transistor increase, the switching time of the transistor also increases. This means that it takes longer for the transistor to transition from an on state to an off state or from an off state to an on state. Thus, the maximum frequency at which a transistor can switch between on and off states decreases as the gate-to-source and gate-to-drain capacitances increase.

As shown in FIG. 1, there are four capacitors that may exist for each vertical slit transistor, Cgs1, Cgs2, Cgd1, and Cgd2. The value of a capacitor is set forth in the known equation for capacitors:

$$C = k\frac{A}{d},$$

where k is a factor that includes the dielectric constant, A is area, and d is the distance between the plates, which in this case are the gate and either the source or drain, respectively, Cgs being a gate-to-source capacitor and Cgd being a gate-to-drain capacitor. The prior art has a relatively short distance which will increase the value of the capacitors. Higher capacitor values tend to slow down transistor operation.

BRIEF SUMMARY

One embodiment is an integrated circuit die including a vertical slit transistor. The integrated circuit die includes a semiconductor substrate having a raised region in which the source, drain, and channel regions of the transistor are positioned. Gate electrodes are positioned on recessed portions of the semiconductor substrate adjacent to the channel region of the vertical slit transistor. Respective gate dielectrics separate the gate electrodes from the channel region. A second dielectric material is positioned on the recessed area of the semiconductor substrate between the gate dielectrics and the source and drain regions. Thus, the source and drain regions are separated from the gate electrodes by the gate dielectrics and the second dielectric material. In this manner, the gate-to-source and gate-to-drain capacitances of the transistor are decreased.

In one embodiment, the vertical slit transistor further includes a dielectric sidewall spacer positioned on the semiconductor substrate above the channel region. A portion of the gate dielectrics and the gate electrodes protrude above the raised portion of the semiconductor substrate adjacent to the channel region. The sidewall spacer is formed abutting a sidewall of one or both of the gate dielectrics directly over the channel region. Because the channel region is covered by the sidewall spacer, dopant ions can be implanted into the source and drain regions with the sidewall spacer acting as a mask over the channel region in a self-aligned manner. Thus, the dopant ions can be implanted into the source and drain regions without the need of further photolithography steps after formation of the sidewall spacer.

BRIEF DESCRIPTION OF THE SEVERAL VIEWS OF THE DRAWINGS

FIG. 1 is top view of a known integrated circuit die including a vertical slit transistor.

DETAILED DESCRIPTION

Figure 2A:
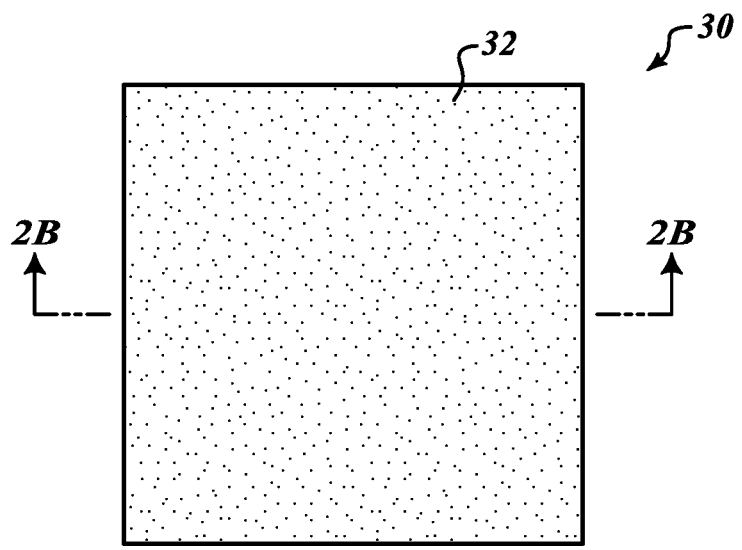
FIGS. 2A-2O illustrate views of an integrated circuit die including a vertical slit transistor at various stages of processing, according to one embodiment.
Figure 2B:
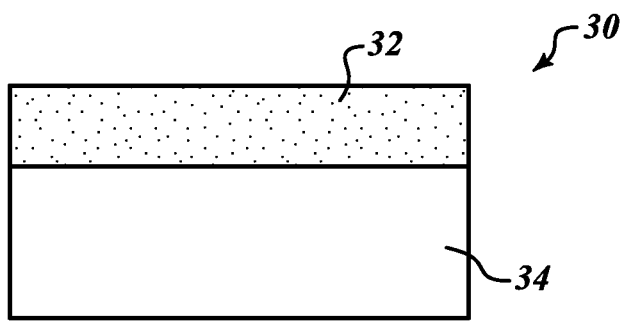

FIG. 2A is a top view of an integrated circuit die 30 at an intermediate stage of processing. A layer of dielectric material 32 covers the integrated circuit die 30. FIG. 2B is a cross-section of the integrated circuit die 30 taken along cross-section lines 2B. As seen in FIG. 2B, the integrated circuit die 30 includes a semiconductor substrate 34 and the layer of dielectric material 32 positioned on the semiconductor substrate 34.

The semiconductor substrate 34 is, for example, monocrystalline silicon. Alternatively, the semiconductor substrate 34 can be another semiconductor material such as silicon germanium or gallium arsenide. The semiconductor layer 34 can be a standard silicon substrate or can be an epitaxial layer that is 100-500 nm thick. The layer of dielectric material 32 is a low K dielectric such as silicon dioxide. It can also be a somewhat higher value dielectric, such as silicon nitride on top of a pad oxide. It can also be an ultra-low K dielectric such as a nanoporous oxide, or others known in the art. The layer of dielectric material 32 is about 35-50 nm in thickness.

Figure 2C:
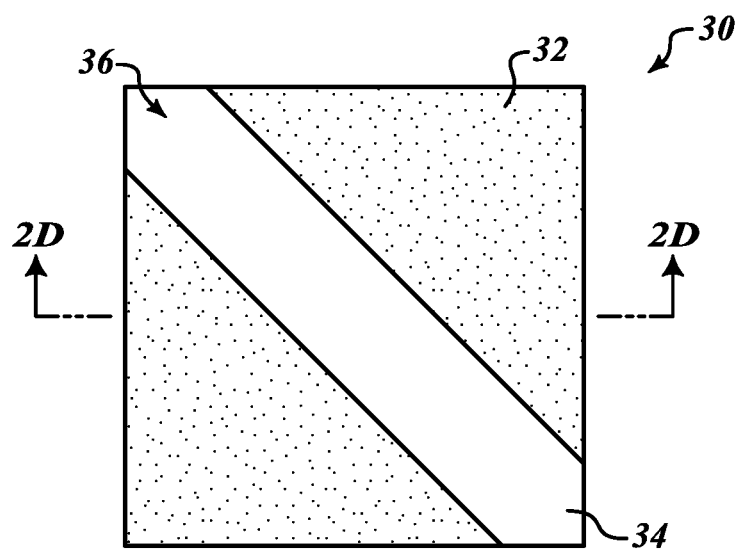

FIG. 2C is a top view of the integrated circuit die 30 after a trench 36 has been etched in the layer of dielectric material 32. The trench 36 exposes the semiconductor substrate 34. The trench 36 is about 15-50 nm wide at its narrowest measurement.

The trench 36 can be formed according to known photolithography techniques. In particular, a mask can be formed and patterned on the layer of dielectric material 32. The trench 36 can be formed by etching a portion of the layer of dielectric material 32 that is exposed by the pattern of the mask. In one example, the trench 36 can be formed by etching the layer of dielectric material 32 with hydrofluoric acid (HF) which selectively etches the silicon dioxide of the layer of dielectric material 32 with respect to the silicon of the semiconductor substrate 34.

Figure 2D:
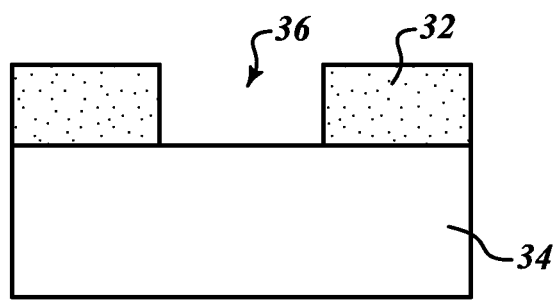

FIG. 2D is a cross-section of the integrated circuit die 30 taken along cross-section lines 2D of FIG. 2C. The cross-section of FIG. 2D illustrates that the trench 36 stops at the surface of the semiconductor substrate 34.

Figure 2E:
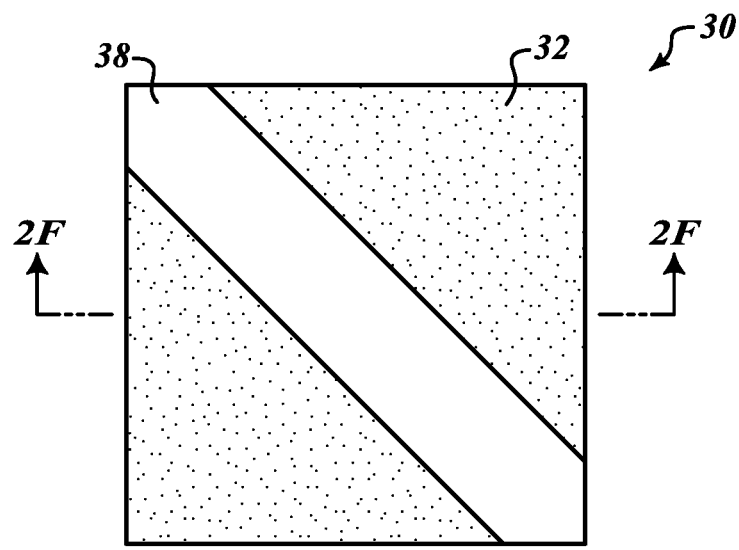

FIG. 2E is a top view of the integrated circuit die 30 after the trench 36 has been filled with a raised portion of semiconductor material 38. The raised portion of semiconductor material 38 is more apparent in the cross-sectional view of FIG. 2F, taken along cross-section lines 2F from FIG. 2E.

In one embodiment, the raised portion of semiconductor material 38 is monocrystalline silicon formed by an epitaxial growth from the semiconductor substrate 34. The epitaxial growth causes the raised portion of semiconductor material 38 to be monocrystalline with the semiconductor substrate 34. In one embodiment, the epitaxial growth is an intrinsic epitaxial growth in which dopant ions are not included in the epitaxial growth. Alternatively, the raised portion of semiconductor material 38 can be lightly doped in situ during the epitaxial growth. If the vertical slit transistor to be formed from the raised portion of semiconductor material 38 is to be an N-channel device, then the in situ light doping during the epitaxial growth can be P-type. If the vertical slit transistor to be formed from the raised portion of semiconductor material 38 is to be a P-channel device, then the in situ light doping during the epitaxial growth can be N-type.

In an alternative embodiment, the raised portion of semiconductor material 38 can be of a semiconductor material different than the semiconductor substrate 34. For example, the raised portion of semiconductor material 38 can be a silicon germanium combination. The silicon germanium can also be epitaxially grown from the semiconductor substrate 34 because of the near match in lattice spacing between silicon germanium and silicon. The slight mismatch in lattice spacing can also introduce beneficial strain into the raised portion of semiconductor material 38 which will provide improved conductivity in the channel region of the vertical slit transistor to be formed in the raised portion of semiconductor material 38, as will be described in greater detail below. The raised portion of semiconductor material 38 can also be any other suitable III-V semiconductor material.

After formation of the raised portion of semiconductor material 38, the surface of the raised portion of semiconductor material 38 is made planar with the top surface of the layer of dielectric material 32. This can be accomplished with a chemical mechanical planarization process (CMP).

Figure 2F:
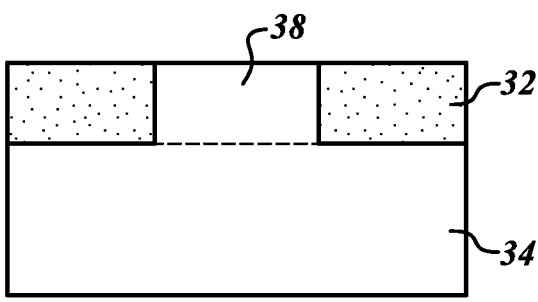
Figure 2G:
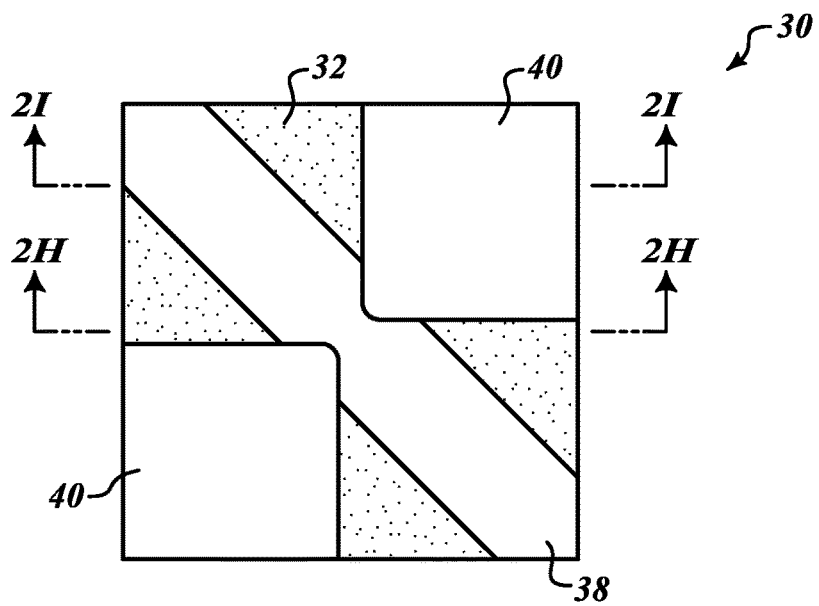

FIG. 2G is a top view of the integrated circuit die 30 after recesses 40 have been formed in the layer of dielectric material 32 and the raised portion of semiconductor material 38. The recesses 40 can be formed by photolithographically masking and etching the raised portion of semiconductor material 38 and the layer of dielectric material 32 in the selected pattern. A first photolithography process can be used to remove the small sections of the raised portion of semiconductor material 38. In particular, the mask is applied to expose small sections of the raised portion of semiconductor material 38. Potassium oxy hydride (KOH) can then be used to etch the silicon of the raised portion of semiconductor material 38 at the exposed areas. A second photolithography process removes portions of the layer of dielectric material 32 to expose the semiconductor substrate 34. HF can be used to remove the silicon dioxide of the layer of dielectric material 32.

Figure 2H:
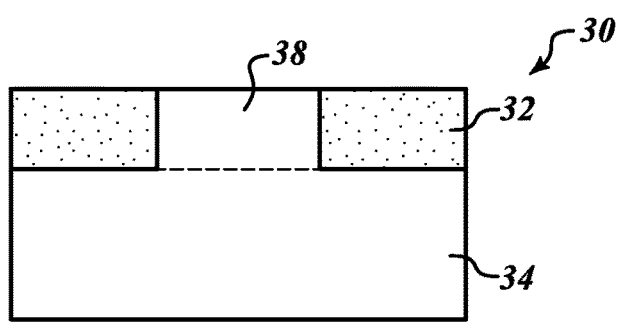
Figure 2I:
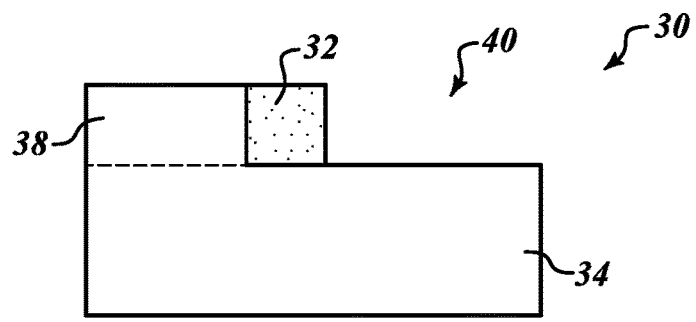

The upper-right recess 40 is shown more clearly in the cross-section of FIG. 2I. FIG. 2I is a cross-section of the integrated circuit die 30 of FIG. 2G taken along cross-section lines 2I. As illustrated in FIGS. 2G and 2I, a portion of the layer of dielectric material 32 remains between the recesses 40 and the raised portion of semiconductor material 38. This will have a notable effect on the vertical slit transistor as will be discussed in more detail below.

FIG. 2H is a cross-section of the integrated circuit die 30 of FIG. 2G taken along cross-section lines 2H. Cross-section lines 2H do not pass through the recesses 40. Therefore, the cross-section of FIG. 2H is identical to the cross-section of FIG. 2E.

Figure 2J:
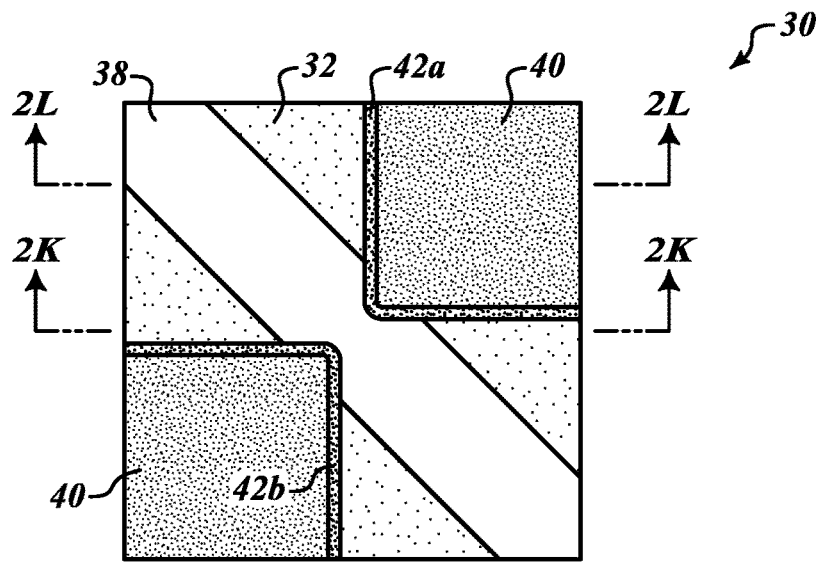

FIG. 2J is a top view of the integrated circuit die 30 after gate dielectrics 42a, 42b have been formed on the sidewalls of the recesses 40. In particular, the gate dielectrics 42a, 42b are formed on the exposed sidewalls of the raised portion of semiconductor material 38.

In one embodiment, the gate dielectrics 42a, 42b are of a high K dielectric material having a thickness between 1 and 2 nm. The gate dielectrics 42a, 42b can include one or more of hafnium, zirconium, oxides of hafnium or zirconium, or other suitable materials for a high K gate dielectric. The gate dielectrics 42a, 42b can be deposited by CVD, atomic layer deposition (ALD), physical vapor deposition (PVD), or any other suitable process for forming a high K gate dielectric. Alternatively, the gate dielectrics 42a and 42b may be partially or fully grown from the exposed semiconductor material(s) (e.g., raised portion of semiconductor material 38 at the exposed channel region). The thickness of the gate dielectrics 42a, 42b can be selected to achieve a particular value of the threshold voltage $V_{th}$ of the verticals transistor.

Figure 2K:
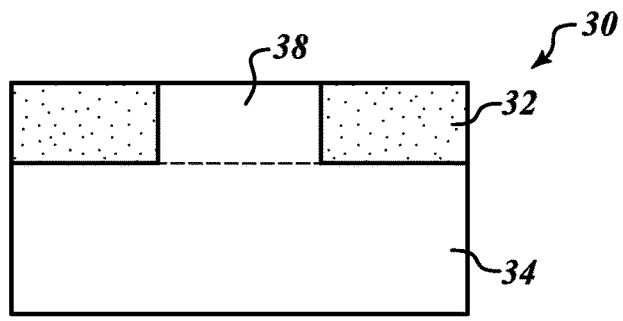

FIG. 2K is a cross-section of the integrated circuit die 30 of FIG. 2J taken along cross-section lines 2K. Cross-section lines 2K do not pass through the recesses 40. Therefore, the cross-section of FIG. 2K is identical to the cross-section of FIGS. 2E, 2H.

Figure 2L:
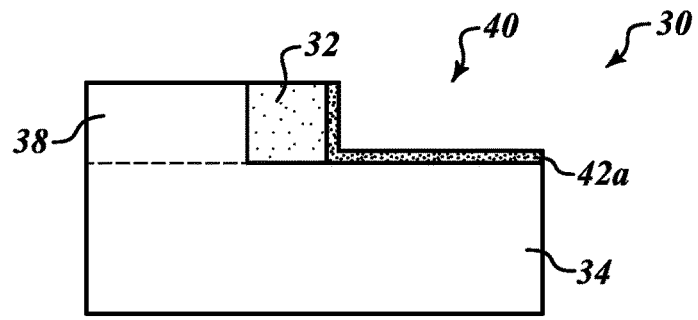

FIG. 2L is a cross-section of the integrated circuit die 30 of FIG. 2J taken along cross-section lines 2L. FIG. 2L more clearly illustrates the relative thinness of the gate dielectric 42a and shows the positioning of the gate dielectric 42a on the sidewall of the layer of dielectric material 32 and the raised portion of semiconductor material 38. The portion of the gate dielectric 42a that is on the sidewall of the raised portion of semiconductor material 38 is the portion that functions as a gate dielectric separating a gate electrode from the channel region of the vertical slit transistor as will be described in more detail below.

Figure 2M:
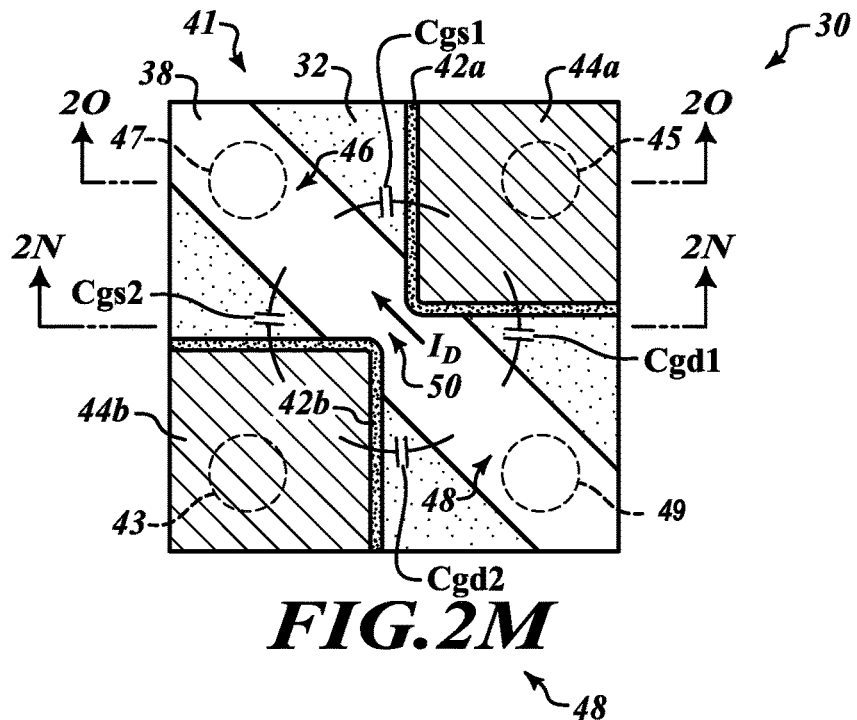

FIG. 2M is a top view of the integrated circuit die 30 including a vertical slit transistor 41 after gate electrodes 44a, 44b have been formed in the recesses 40. The gate electrodes 44a, 44b are formed by depositing a conductive material such as highly doped polysilicon into the recesses 40. Alternatively, the gate electrodes 44a, 44b can be formed of a metal such as aluminum, or one or more metal layers such as a thin barrier layer of titanium nitride with a thicker layer of tungsten positioned on top of the barrier layer of titanium nitride. The gate electrodes 44a, 44b can be deposited by CVD, plasma enhanced CVD (PECVD), physical vapor deposition (PVD) or any other suitable process, for example.

After deposition of the gate electrodes 44a, 44b, a planarization step is then performed to make the top surface of the gate electrodes 44a, 44b planar with the layer of dielectric material 32 and the raised portion of semiconductor material 38.

In one embodiment, after formation of the gate electrodes 44a, 44b, a source region 46 and a drain region 48 are formed in the raised portion of semiconductor material 38 by photolithographically masking the section of the raised portion of semiconductor material 38 directly between the gate electrodes 44a, 44b and then implanting dopant ions into the rest of the raised portion of semiconductor material 38, thereby forming source and drain regions 46, 48 in the raised portion of the semiconductor material 38. The doping of the source and drain regions 46, 48 can be performed in multiple implantation steps. For example, in the presence of the mask covering the space between the gate electrodes 44a, 44b, the integrated circuit die 30 can be tilted during a light dopant implantation in order to form lightly doped source and drain regions close to the channel region 50 between the first and second gate electrodes 44a, 44b.

The dashed circle 47 denotes an area in which a source contact will contact the source region 46. The dashed region 49 denotes an area in which a drain contact will contact the drain region 48. The dashed circles 45, 43 denote respective gate contact regions for the gate electrodes 44a, 44b. In one embodiment, the source region 46 and the drain region 48 can be covered in silicide. Although shown as circular or cylindrical structures in this embodiment, the contacts 49 and 47 may have any other suitable shape and may be larger in width and/or length than all or part of the drain region 48 and the source region 46, respectively.

Figure 2N:
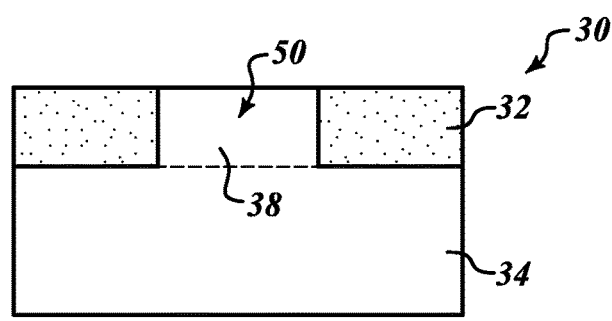

FIG. 2N is a cross-section of the integrated circuit die 30 of FIG. 2M taken along cross-section lines 2N. Cross-section lines 2N pass through the channel region 50 of the transistor 41.

Figure 2O:
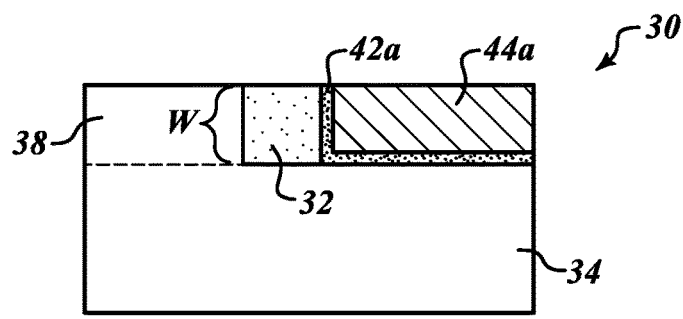

FIG. 2O is a cross-section of the integrated circuit die 30 of FIG. 2M taken along cross-section lines 2O. FIG. 2O more clearly illustrates that the gate electrode 44a is positioned on the gate dielectric 42a and is planar with the layer of dielectric material 32 and the raised portion of semiconductor material 38. Furthermore, FIG. 2O illustrates that the channel width W of the transistor 41 corresponds to the height of the raised portion of semiconductor material 38. Or stated another way, the channel width W of the vertical slit transistor 41 corresponds to the depth of the portion of the gate electrode 42a, 42b that is in contact with the raised portion of semiconductor material 38.

The vertical slit transistor 41 can act as a switch like a conventional CMOS transistor. When the transistor 41 is turned on a drain current $I_D$ flows between the drain 48 and the source 46. When the transistor is turned off, substantially no current flows from the drain 48 to the source 46. The transistor 41 can be either an N-channel device or P-channel device. In an example in which the transistor 41 is an N-channel device, the source region 46 and the drain region 48 are doped with N-type dopant atoms. When a positive voltage is applied between the drain 48 and the source 46 the transistor 41 can be turned on by applying a positive voltage to the gate electrodes 44a, 44b with respect to the source 46. The transistor 41 can be turned off by applying the same voltage to the gate electrodes 44a, 44b as is applied to the source 22.

The presence of two gates 44a, 44b adjacent to the channel region 50 allows for very strong inversion of the channel region 50 giving the transistor 41 a relatively large and rapid drain current $I_D$ when the transistor 41 is turned on. Likewise, the presence of two gate electrodes 44a, 44b adjacent to the channel region 50 allows for the transistor 41 to effectively stop any current from flowing between the drain 48 and the source 46.

The vertical slit transistor 41 does not suffer from some of the drawbacks of the transistor 20 of FIG. 1. The vertical slit transistor 41 of FIG. 2M can have a much faster switching speed than the transistor 20 of FIG. 1. This is because the gate-to-source and gate-to-drain capacitances (Cgs1, Cgs2, Cgd1, and Cgd2) of the transistor 41 are significantly reduced with respect to the gate-to-source and gate-to-drain capacitances of the transistor 20 of FIG. 1.

As shown in FIGS. 2M and 2O, the gate 44 is now separated from the source and drain regions by two dielectrics, the gate dielectric 42 and the overlay dielectric 32. Since the overlay dielectric 32 has a relatively low dielectric constant, the capacitor value is low. Further, the distance d has increased between the two electrodes, the gate and the source and/or drain. This increase in d can be seen also in FIG. 2) as the sum of the width of dielectric layers 42a and 32. Accordingly, two of the factors that determine capacitor value, the dielectric constant and the distance, are both changed to cause the value of the capacitors Cgs and Cgd to be lower, which will increase speed of the transistor operation.

The reduction in capacitance can be seen more clearly by noting that the capacitance of a capacitor is inversely proportional to the distance between the two conductive plates of the capacitor and is proportional to the surface area between the two conductive plates and the dielectric constant K of the dielectric material between the two conductive plates. In the transistor 20 of FIG. 1, the conductive gate electrode 26a is separated from the conductive source and drain regions 22, 24 only by the thin the gate dielectric 28a. The gate electrode 26b is similarly close to the source and drain regions 22, 24. However, in the transistor 41 of FIG. 2M the gate electrodes 44a, 44b are further separated from the source and drain regions 46, 48 by the layer of dielectric material 32. Thus, because of the increased distance between the gate electrodes 44a, 44b and the source and drain regions 46, 48, the gate-to-source and gate-to-drain capacitances of the transistor 41 are greatly reduced with respect to the transistor 20 of FIG. 1. This reduction in capacitance is further enhanced by the fact that the layer of dielectric material 32 has a much lower dielectric constant K than the gate dielectric's 42a, 42b. This reduction in the gate-to-source and gain to drain capacitances corresponds to an increase in switching speed or switching frequency of the transistor 41. This means that the transistor 41 can be turned on and off at a much higher frequency than the transistor 20 of FIG. 1.

The transistor 41 of FIGS. 2M-2O further reduces gate induced drain leakage (GIDL) because of the thick layer of dielectric material 32. This is particularly advantageous in high threshold voltage (Vth) devices such as SRAMs.

Those of skill in the art will recognize, in light of the present disclosure, that many other materials, processes, dimensions, and features can be implemented in a vertical slit transistor. All such other materials, processes, dimensions, and features fall within the scope of the present disclosure.

Figure 3A:
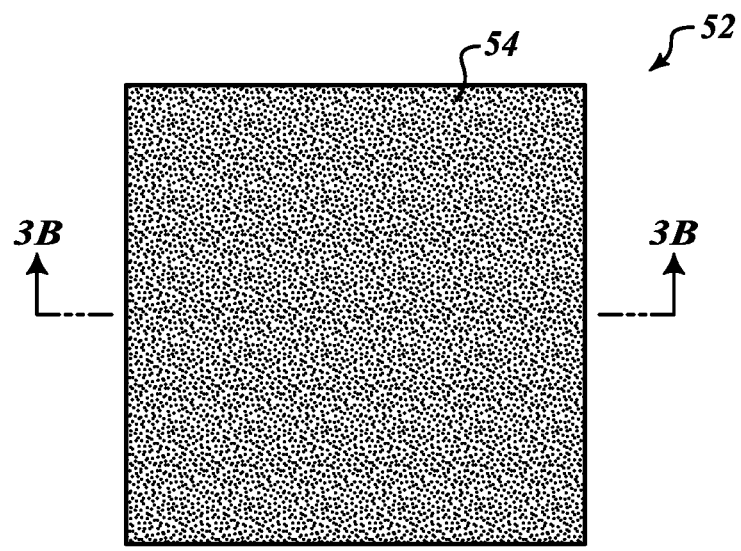
FIGS. 3A-3Q illustrate views of an integrated circuit die including a vertical slit transistor at various stages of processing, according to one embodiment.
Figure 3B:
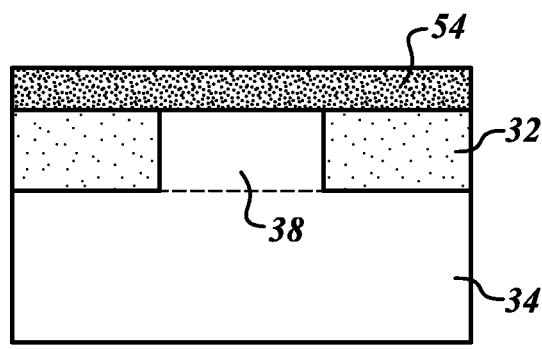

FIG. 3A is a top view of an integrated circuit die 52 at an intermediate stage of processing, according to one alternative embodiment. FIG. 3B is a cross-section of the integrated circuit die 52 of FIG. 3A taken along cross-section lines 3B. Layers and materials of the integrated circuit die 52 that have an analogous layer in the integrated circuit die 30 are numbered with the same reference numbers as the respective layers and features of the integrated circuit die 30.

The integrated circuit die 52 of FIGS. 3A, 3B corresponds to the integrated circuit die 30 of FIGS. 2E, 2F in one embodiment. In particular, a layer of dielectric material 32 has been formed on a semiconductor substrate 34. A raised portion of semiconductor material 38 has been epitaxially grown in the trench 36 formed diagonally across the layer of dielectric material 32. Differently from FIGS. 2E, 2F, a second layer of dielectric material 54 has been formed on the layer of dielectric material 32 and the raised portion of semiconductor material 38. The second layer of dielectric material 54 is, for example, a layer silicon nitride about 50 nm thick.

Figure 3C:
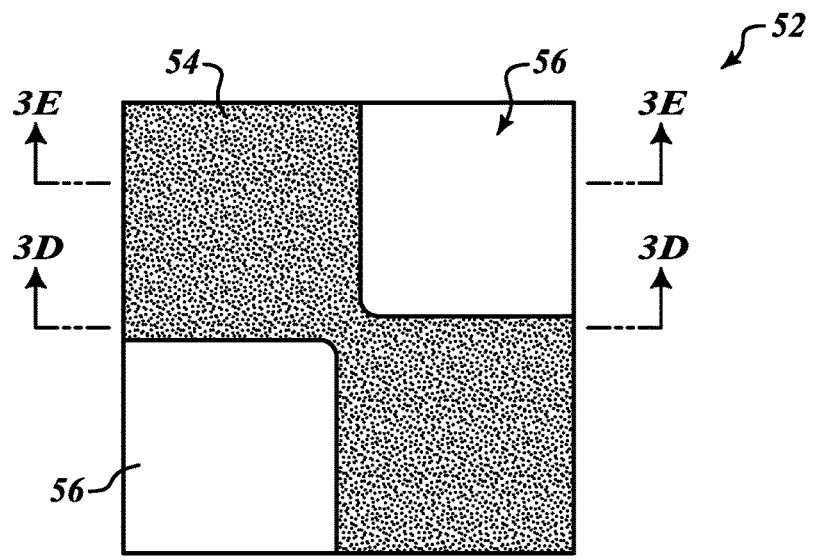

FIG. 3C is a top view of the integrated circuit die 52 after recesses 56 have been formed in the second layer of dielectric material 54, the first layer of dielectric material 32, and the raised portion of semiconductor material 38. The recesses 56 can be formed by photolithographically masking and etching the second layer of dielectric material 54, the raised portion of semiconductor material 38, and the layer of dielectric material 32 in the selected pattern. A first etch process can be performed to remove the selected portions of the second layer of dielectric material 54. A second etch step can be used to remove the selected sections of the raised portion of semiconductor material 38. A third etch step can be performed to remove the selected portions of first layer of dielectric material 32.

Figure 3D:
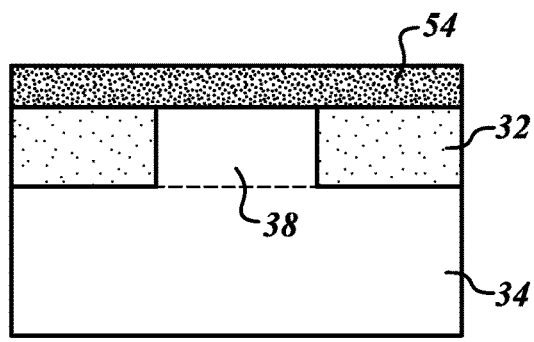

FIG. 3D is a cross-section of the integrated circuit die 52 of FIG. 3C taken along cross-section lines 3D. Cross-section lines 3D do not pass through the recesses 56. Therefore, the cross-section of FIG. 3D is identical to the cross-section of FIG. 3B.

Figure 3E:
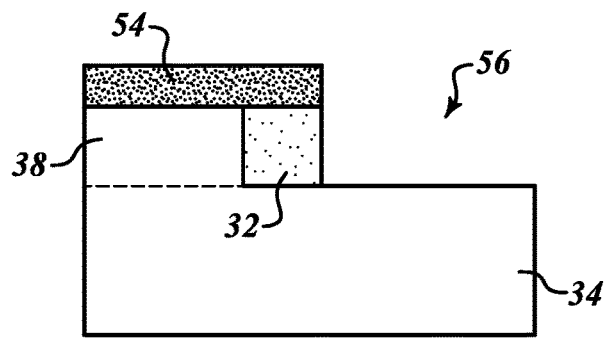

FIG. 3E is a cross-section of the integrated circuit die 52 of FIG. 3C taken along cross-section lines 3E. The upper-right recess 56 is shown more clearly in the cross-section of FIG. 3E.

Figure 3F:
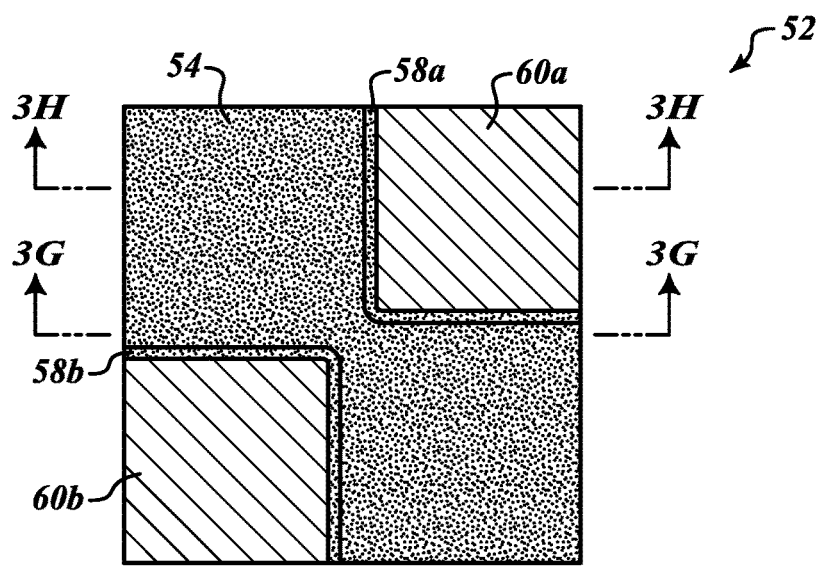

FIG. 3F is a top view of the integrated circuit die 52 after gate dielectrics 58a, 58b and gate electrodes 60a, 60b have been formed in the recesses 56. In particular, the gate dielectrics 58a, 58b are formed on the exposed sidewalls of the raised portion of semiconductor material 38, on the exposed sidewalls of the first layer of dielectric material 32, and on the exposed sidewalls of the second layer of dielectric material 54.

In one embodiment, the gate dielectrics 58a, 58b are of a high K dielectric material having a thickness between 1 and 2 nm. The gate dielectrics 58a, 58b can include one or more of hafnium, zirconium, oxides of hafnium or zirconium, or other suitable materials for a high K gate dielectric. The gate dielectrics 58a, 58b can be deposited by CVD, atomic layer deposition (ALD), physical vapor deposition (PVD), or any other suitable process for forming a high K gate dielectric. The thickness of the gate dielectrics 58a, 58b can be selected to achieve a particular value of the threshold voltage $V_{th}$ of the verticals transistor.

The gate electrodes 60a, 60b are formed by depositing a conductive material such as highly doped polysilicon into the recesses 56. Alternatively, the gate electrodes 60a, 60b can be formed of one or more metal layers such as a thin barrier layer of titanium nitride with a thicker layer of tungsten positioned on top of the barrier layer of titanium nitride. The gate electrodes 60a, 60b can be deposited by one or more of CVD, plasma enhanced CVD (PECVD), ALD, physical vapor deposition (PVD) or any other suitable process, for example.

Figure 3G:
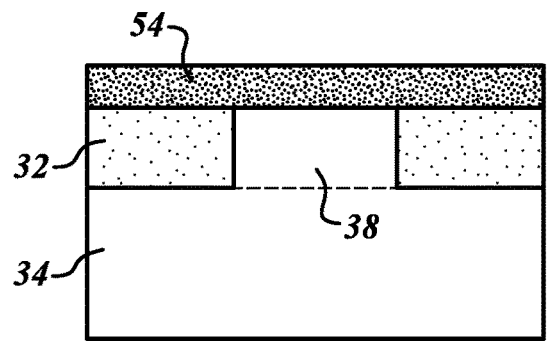

FIG. 3G is a cross-section of the integrated circuit die 52 of FIG. 3F taken along cross-section lines 3G. Cross-section lines 3G do not pass through the recesses 40. Therefore, the cross-section of FIG. 3G is identical to the cross-section of FIGS. 3B and 3D.

Figure 3H:
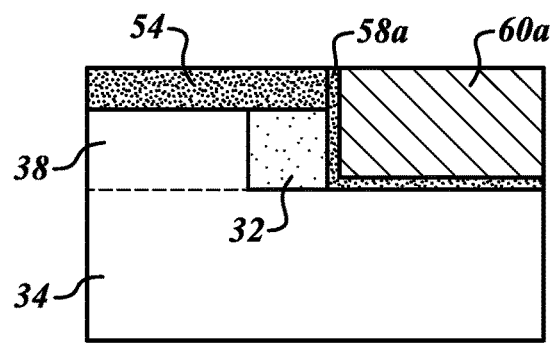

FIG. 3H is a cross-section of the integrated circuit die 52 of FIG. 3F taken along cross-section lines 3F. FIG. 3F more clearly illustrates the relative thinness of the gate dielectric 58a and shows the positioning of the gate dielectric 58a on the sidewall of the layer of dielectric material 32, the sidewall of the second layer of dielectric material 54, and the raised portion of semiconductor material 38. The portion of the gate dielectric 58a that is on the sidewall of the raised portion of semiconductor material 38 is the portion that functions as a gate dielectric separating a gate electrode from the channel region of the vertical slit transistor as will be described in more detail below.

Figure 3I:
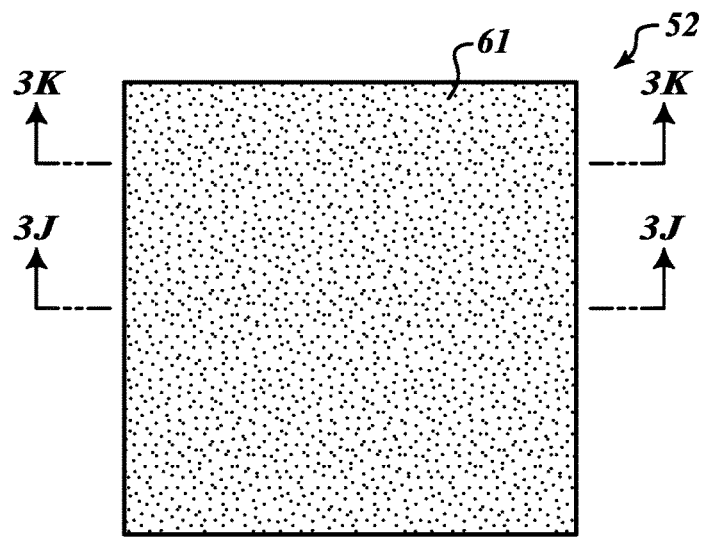
Figure 3J:
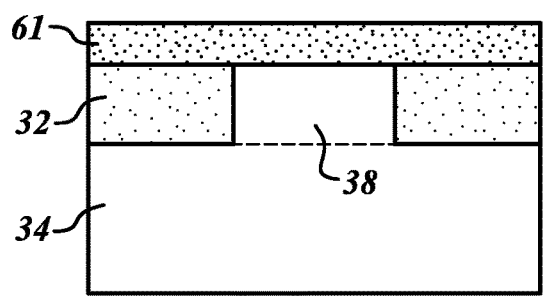
Figure 3K:
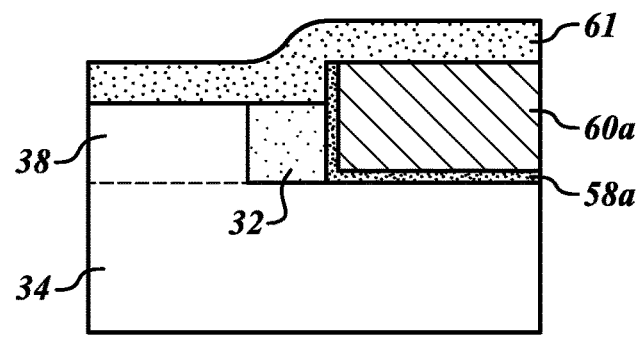

FIGS. 3I-3K for the formation of a sidewall spacer in the vertical slit transistor structure. In a first step, after 3H, the dielectric layer 54 is etched away, to be completely removed. After it has been removed, a sacrificial sidewall layer 61 is blanket deposited over the entire chip. The layer 61, which will become the sidewall spacer, can be any acceptable insulator, including silicon dioxide, silicon nitride, or other compatible insulator with the semiconductor process. In a preferred embodiment, the sidewall spacer layer 61 is a silicon nitride. It may, in some instances include a pad oxide, which is formed over the silicon portions of the wafer so as to avoid crystal dislocations or cracking in the semiconductor substrate 34 or 38. Therefore, in those portions where the silicon substrate itself is exposed, such as regions 38, a relatively thin oxide layer is grown, such a pad oxide, on top of which the silicon nitride layer 61 is deposited. Alternatively, the sidewall spacer can be a pure silicon oxide layer, such as $SiO_2$. After the sidewall spacer layer 61 is blanket deposited, it forms a relatively thick layer 61 in those portions which are over the raised regions, as shown in FIGS. 3J and 3K. However, since it is a relatively conformal deposition, those regions which are spaced from the raised regions will be lower in thickness, as shown in FIG. 3K. Namely, in those regions where the blanket deposited sidewall layer 61 is deposited over the gate electrode 60a, it will have the same thickness as deposited over regions spaced from the channel over the source, as shown in FIG. 3K. However, at the transition between the upstanding edge 58a and 60a of the gate, it will have a height which is approximately twice as high over the substrate, because of the transition. Therefore, when the blanket and isotropic etch is carried out of the layer 61, the portions which are directly over the gate electrode 60a will be fully removed, as will the portions over the source and drain regions, since they all have the same thickness. However, at those portions which are directly adjacent the gate dielectric 58a, a sidewall spacer 62 will be formed.

Figure 3L:
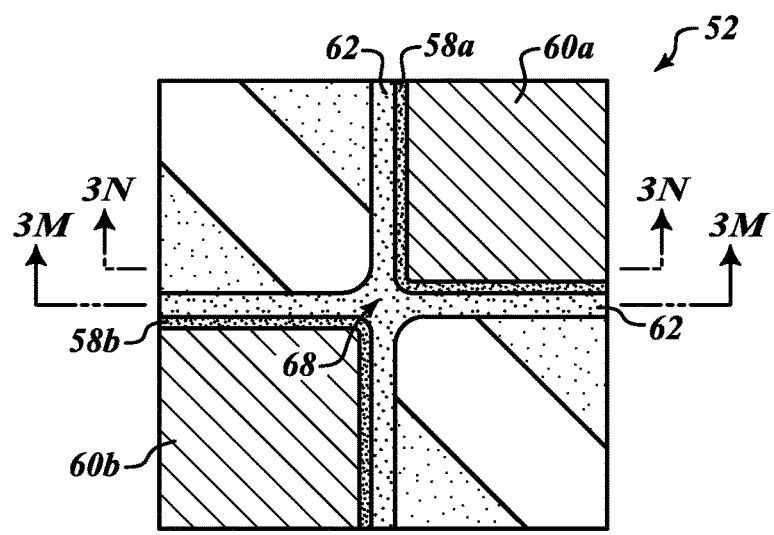

In one embodiment, the two-gate electrode 60a and 60b will be sufficiently close to each other that the area between them will not be etched but will be a remaining portion of the sidewall layer 61, and thus the entire channel itself will have a small region which extends completely from the electrode 60a to the electrode 60b, which is fully covered by the layer 62 after the anisotropic etch. The size of this channel and the area which it covers can be selected based on the thickness of the layer 61, which is blanket deposited over the entire wafer, as shown in FIGS. 3I-3K. If a relatively long channel length, with large spacing, is required, a relatively thick layer 61 will be deposited. On the other hand, if it is desired that the sidewall will be quite small, and the area taken up by the channel have a short channel length, then the layer 61 will be thinner so as to cover only a very small portion of the active area 38, and leave the remaining portion for the source and drain regions. Thus, the length of the channel is selected based on the thickness to which the sidewall spacer 61 is deposited, rather than by photolithographic step. As can be appreciated, the use of photolithography to make very small feature sizes, smaller than 20 nm, or in some devices smaller than 15 nm, is quite difficult. However, with the use of the sidewall spacer as fully defining the channel length in a self-aligning process, as shown in FIG. 3L, the requirement to use a lithographic step to make a small channel is not necessary. Accordingly, the thickness of the layer 61 can be custom selected to have a channel length of any desired length, such as relatively small, 5 nm or less. The ability to determine the channel length based on the thickness of the deposition of a layer permits substantially more fine-tuning of the channel length than is possible for photolithographic masks.

It is possible in the known art to control the height of a layer, such as silicon oxide or silicon nitride, to within a few angstroms of a desired value. For example, it is possible to deposit a layer that is known to be exactly 30 Å thick, plus or minus 2 Å, namely within the range of 28 Å or 32 Å, and often, at exactly 30 Å. Similarly, it is possible to deposit layer 61 to be exactly 50 Å, plus or minus 5 Å; namely, within the range of 45 Å-55 Å, and often, within 2% of 50 Å, rather than within 10%. The gate length can therefore be selected based on measurements in the angstrom range rather than measurements in the nanometer range. It is therefore possible to form a channel region having a length in the range of 50 Å, 100 Å, or 200 Å, without the use of the expensive fill of the graphic masks which, in the range of 20 nm, are very difficult to make, and expensive, and in current technology it is extremely difficult to create a feature size in the 5 nm range and less. Since it is possible in semiconductor technology to deposit layer 61 with a tolerance of thickness that is measured in angstroms rather than nanometers, it is therefore now possible to form a channel whose tolerance can be measured in angstroms instead of nanometers, and also to form a channel region whose length can be measured in angstroms rather than in nanometers.

While is it likely that channels in initial devices made according to this process may be in the 200 Å range, which is 20 nm, it is also possible to deposit layer 61 to a precise thickness, for example exactly 200 Å, and then perform the blanket etch so that the sidewall spacer 62, when fully completed and etched, has a width of 25 Å, 50 Å, or the like. The area over the channel region 68 is the merge of the two sidewall spacers 62, and therefore if a sidewall spacer 62 has a thickness of 50 Å, then at the merged location over the channel region 68, the total channel length will be 100 Å, which is 10 nm. Finally, if the sidewall 62 has a final width of approximately 25 Å, then at the merged location of the channel 68, the sum of the two sidewalls will be approximately 50 Å, which is a channel region of 5 nm. Even smaller channel regions can be made, with smaller channel lengths. Accordingly, using the sidewall deposition and blanket etch technique, the channel length can be custom defined to be in the angstrom range, thus resulting in very high-speed transistors with low voltage and low current capabilities.

Figure 3M:
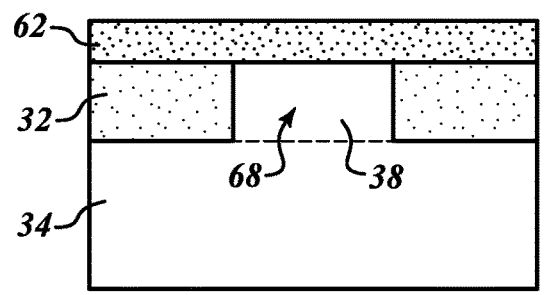
Figure 3N:
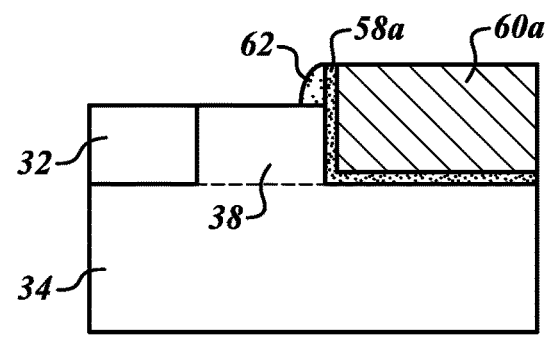

FIG. 3L is a top view of the integrated circuit die 52 after formation of the silicon nitride sidewall spacer 63 on a raised portion of the gate dielectric 58a, 58b. FIGS. 3M, 3N are cross-sections of the integrated circuit die 52 of FIG. 3L taken along cross-section lines 3M, 3N, respectively. FIG. 3K shows the profile of the sidewall spacer 62. Sidewall spacer 62 is formed against portions of the gate dielectric 58a, 58b that extend above the raised portion of semiconductor material 38. The sidewall spacers therefore covers a portion of the raised portion of semiconductor material 38 corresponding to the channel region of a vertical slit transistor as will be described in more detail with reference to FIGS. 3L-3N.

As stated previously, the sidewall spacer 62 can be formed by performing a blanket etch selective without the presence of a mask to entirely remove the second layer of dielectric material 54. After the second layer of dielectric material 54 has been fully removed, a sacrificial layer of silicon nitride 61 is blanket deposited on the integrated circuit die 52 completely covering the integrated circuit die 52. An anisotropic etch of layer GI is then performed in the absence of any mask. The sacrificial layer 61 of silicon nitride will be much thicker adjacent to the raised portion of the gate dielectrics 58a, 58b. Thus, when the anisotropic etch is performed on the sacrificial layer 61 of silicon nitride, the sacrificial layer 61 of silicon nitride can be completely removed from all portions of the integrated circuit die 52 except adjacent to the raised portion of the gate dielectrics 58a, 58b where the sacrificial layer 61 of silicon nitride was much thicker. Thus, the anisotropic etch will leave a portion of the sacrificial layer 61. This remaining portion of the sacrificial layer is the sidewall spacer 62 shown in FIGS. 3L-3Q. The sidewall spacer 62 is about 50 nm tall and about 6 nm wide. The sidewall spacer 62 can be formed without the need for costly and time-consuming photolithography steps. As will be explained in more detail below, the sidewall spacer 62 enables easy formation of the source and drain regions in the raised portion of semiconductor material 38.

Figure 3O:
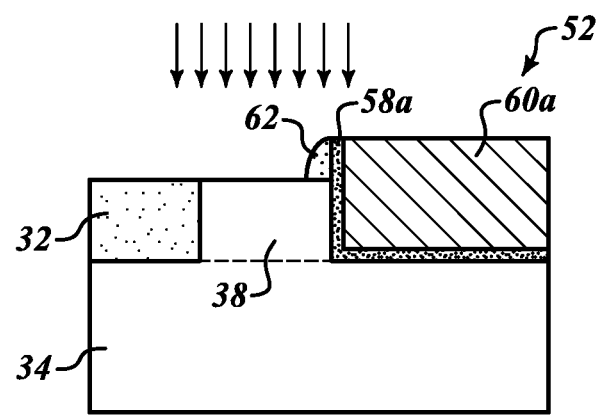
Figure 3P:
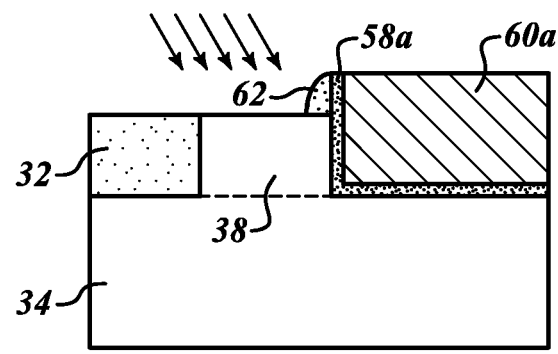

FIGS. 3O, 3P are cross-sections of the integrated circuit die 52 corresponding to FIG. 3N. FIGS. 3O, 3P illustrate implantation of dopant ions to form source and drain regions in the raised portion of semiconductor material 38. Sidewall spacer 62 allows for dopant ions to be implanted without the need of a photolithography mask. The sidewall spacer 62 serves as a hard mask for dopant ion implantation. The spacer 62 allows for self-reliant procedure to ensure proper extension overlap of the source and drain regions with the channel region and prevents source and drain punch through leakage current.

In FIG. 3O a high concentration of dopant ions is implanted vertically into the raised portion of semiconductor material 38 in order to form highly doped source and drain regions and the raised portion of semiconductor material 38. The sidewall spacer 62 prevents the heavy dopant implantation from being implanted in the channel region of the vertical slit transistor. The formation of the source and drain regions is therefore fully self-aligned and is carried out without a further photolithographic step or separate mask.

These steps of forming a self-aligned spacer structure and performing a dopant implantation may be performed multiple times to provide a lightly doped region near the channel region and then form more heavily doped regions further from the channel region, for example. Hence, a resulting spacer structure of a device may have multiple layers of same or different materials.

In FIG. 3P lightly doped drain regions are formed by tilting the integrated circuit die 52 during ion implantation, as an alternative way to form lightly doped regions. Thus, a low concentration of dopant ions will penetrate below a portion of the sidewall spacer 62, thereby forming lightly doped source and drain regions in a self-reliant process without extra photolithography masks.

In an alternative embodiment, the lightly doped source and drain regions are formed in the presence of a relatively thin sidewall spacer. Afterward, a relatively thick sidewall spacer is formed by repeating the steps shown in FIGS. 3I-3K as described herein. Highly doped source and drain regions are formed by implanting ions into the raised portion of semiconductor material 38 in the presence of the thick sidewall spacer.

Those of skill in the art will recognize, in light of the present disclosure, that many other materials, processes, dimensions, and features can be implemented in a vertical slit transistor. All such other materials, processes, dimensions, and features fall within the scope of the present disclosure.

Figure 3Q:
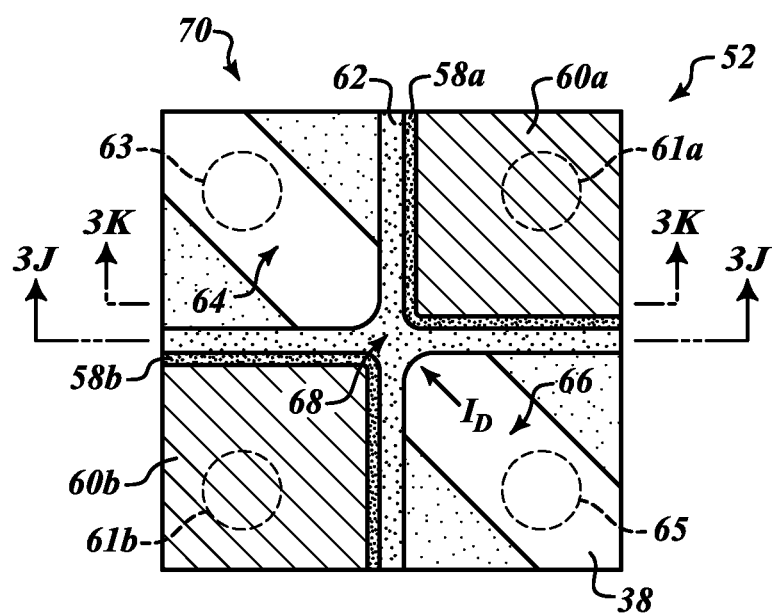
Figure 4A:
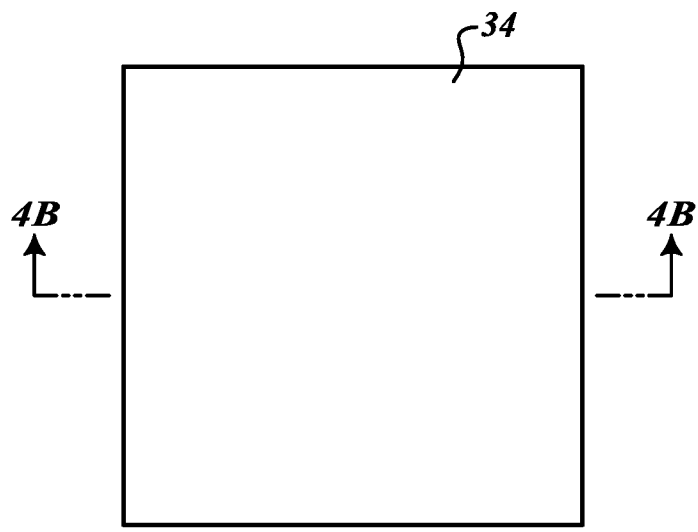
FIGS. 4A-4F illustrate views of an integrated circuit die including a vertical slit transistor at various stages of processing, according to one embodiment.
Figure 4B:
Figure 4C:
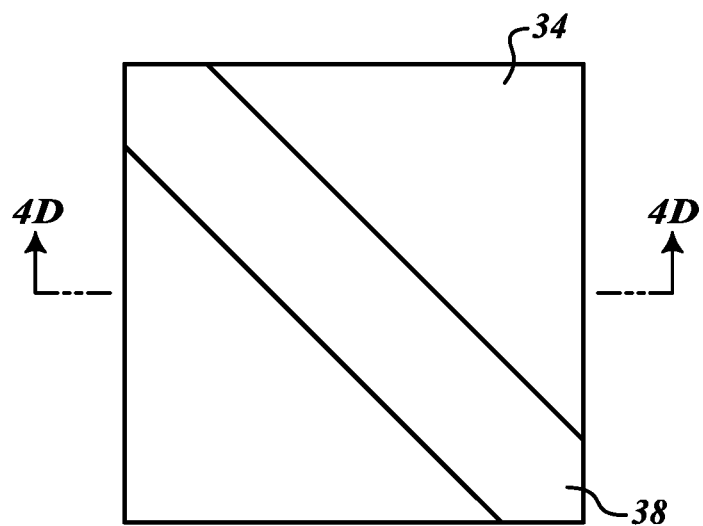
Figure 4D:
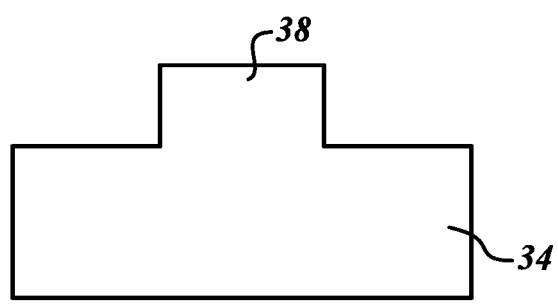
Figure 4E:
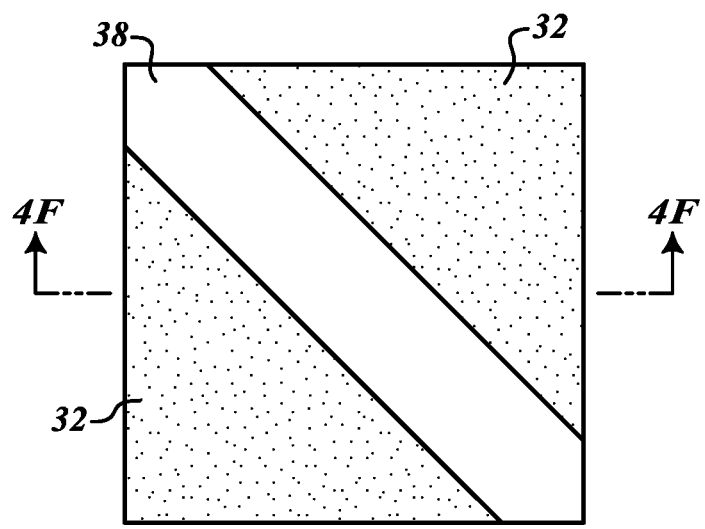
Figure 4F:
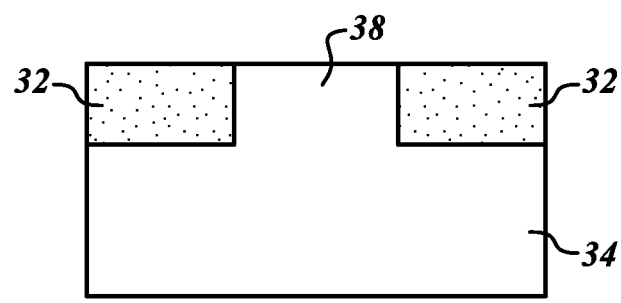
Figure 5A:
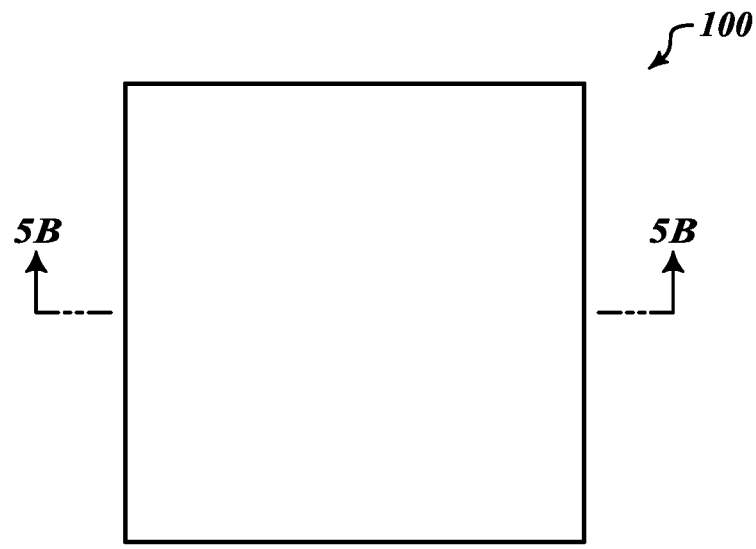
FIGS. 5A-5F illustrate views of an integrated circuit die including a vertical slit transistor at various stages of processing, according to one embodiment.
Figure 5B:
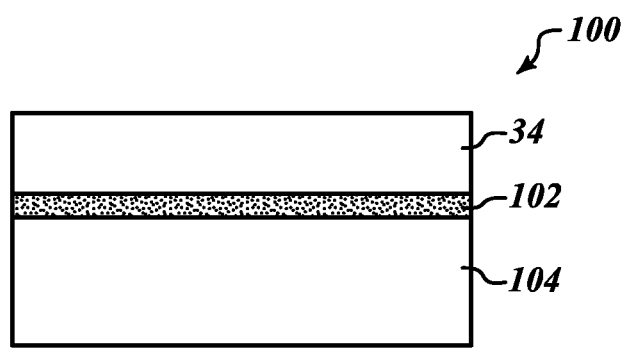
Figure 5C:
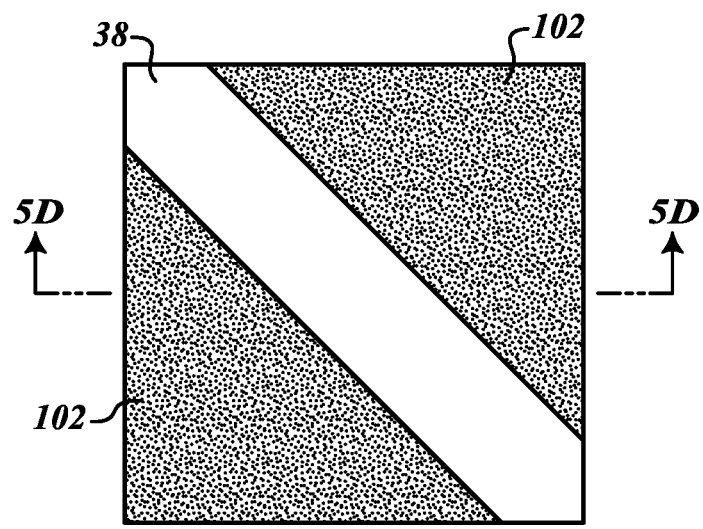
Figure 5D:
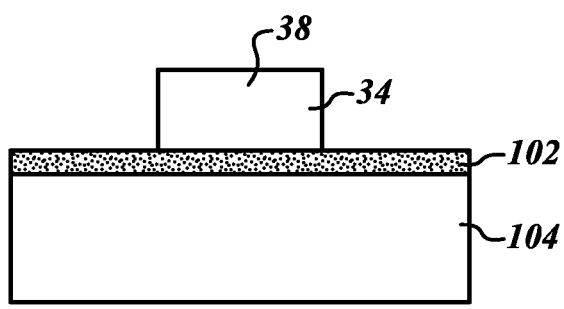
Figure 5E:
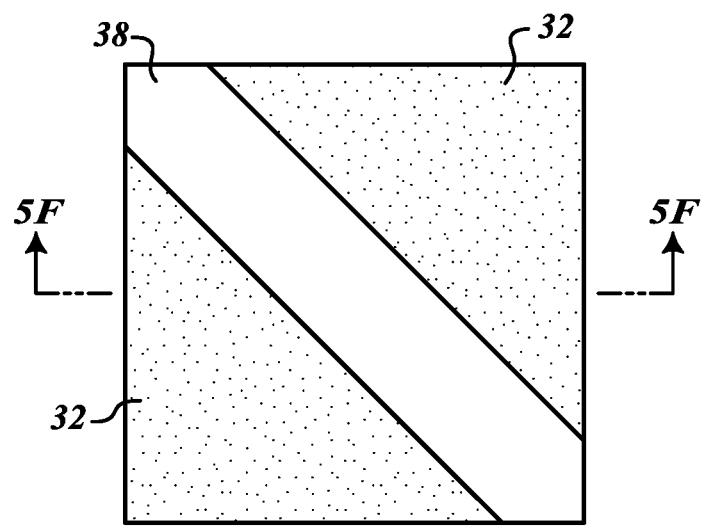
Figure 5F:
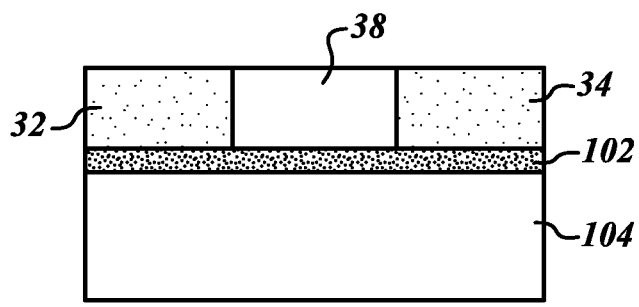

FIG. 3Q is a top view of the integrated circuit die 52 including a vertical slit transistor 70 formed therein. In particular, a source region 64, a drain region 66, and a channel region 68 are formed in the raised portion of semiconductor material 38. A source contact 63, a drain contact 65, a first gate contact 61a, and a second gate contact 61b are denoted by respective dashed circles.

The transistor 70 of FIG. 3Q functions in the same manner as the transistor 41 of FIG. 2M. The transistor 70 of FIG. 3N includes all of the benefits of the transistor 41. The transistor 70 further includes the benefit of a sidewall spacer that allows for self-aligned source, drain, and channel regions without the need for costly photolithography steps.

The embodiments of FIGS. 2A-2O and 3A-3N can each be practiced alone or in combination with each other.

The embodiments of FIGS. 2A-3Q have been formed by first forming the dielectric layer 32 and then etching a trench 36, in which a monocrystalline fin is epitaxially grown within the bounds of the trench 36. This may be done by starting with a bulk wafer, forming a blanket dielectric layer 32 thereon.

In an alternative processing method to arrive at the same or very similar resulting structure for a vertical fin transistor as described above, according to one alternative embodiment, the monocrystalline fin 38 is formed by patterning (e.g., spacer image transfer or SIT process) and etching into the bulk silicon substrate or into a top semiconductor layer of an SOI wafer. Then, after the fin 38 is formed, the dielectric layer 32 is formed in the recesses between fin 38 and other fins or other adjacent regions not etched when forming fin 38. These alternative beginning steps of alternative embodiments are shown in FIGS. 4A to 4F using the same feature numbering as FIGS. 2A-2F, for example. Then, the remainder of the process method can be the same as that described above regarding exemplary illustrations in FIGS. 2G-2O and/or FIGS. 3C-3Q.

FIGS. 5A to 5F show yet another alternative embodiment to arrive at an intermediate structure preceding process steps described for the remainder of process methods described above regarding exemplary illustrations in FIGS. 2G-2O and/or FIGS. 3C-3Q. If starting with an SOI wafer 100 (semiconductor-on-insulator, SiGe-on-insulator, III-V-on-insulator, or silicon-on-insulator wafer collectively referred to generically as SOI wafer here) as in FIGS. 5A-5F, then there will be a buried oxide layer 102 located below the fin 38 and separating/insulating the fin 38 from the underlying substrate 104. If the buried oxide layer 102 is made relatively thin (e.g., UTBB wafer) (e.g., less than 20 nm), then the underlying substrate 104 (or at least a portion of the underlying substrate 104 under the channel region) may be biased differently than the gate electrodes 44*a* and 44*b*, or 60*a* and 60*b*, to further vary the characteristics of the transistor. Furthermore, an advantage of a vertical slit transistor structure is that one gate electrode (e.g., 44*a* or 60*a*) may be electrically biased differently than the other gate electrode (e.g., 44*b* or 60*b*), and/or may be differently yet again from a bias of an underlying substrate of a UTBB substrate; hence, there may be 2 or 3 different biases imposed on the channel region, and/or biasing the gate electrodes (44*a*, 44*b*, 60*a*, 60*b*) and/or underlying substrate 104 in different timing sequences (varying or not varying the bias voltage among them) to vary the characteristics of the transistor.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a raised semiconductor region above a semiconductor substrate;
   forming a gate dielectric on a first sidewall of the raised semiconductor region;
   forming a gate electrode having a sidewall abutting the gate dielectric, the sidewall of the gate electrode being separated from the first sidewall of the raised semiconductor region by the gate dielectric, the gate dielectric being positioned between the sidewall of the gate electrode and the raised semiconductor region;
   forming a dielectric spacer on a top surface of the raised semiconductor region; and
   forming source and drain regions in the raised semiconductor region by implanting dopants into the raised semiconductor region using the dielectric spacer as a mask, wherein forming the raised semiconductor region includes:
      forming a dielectric layer overlying the semiconductor substrate;
      removing a section of the dielectric layer to create an open slot in the dielectric layer extending in a first direction;
      epitaxially growing a semiconductor material in the slot from the semiconductor substrate, the semiconductor material extending in the first direction; and
      removing a portion of the dielectric layer and the semiconductor material using a single mask to leave the raised semiconductor region of the semiconductor material and a dielectric material region of the dielectric layer abutting each other.

2. The method of claim 1, wherein forming the source and drain regions in the raised semiconductor region includes forming a channel region of the raised semiconductor region between the source and drain regions.

3. The method of claim 1, wherein forming the gate dielectric includes forming the gate dielectric on the first sidewall of the raised semiconductor material and on a first sidewall of the dielectric material region.

4. The method of claim 1, wherein a sidewall of the drain region is parallel to a sidewall of the gate electrode and is separated from the gate electrode by both the dielectric layer and the gate dielectric.

5. The method of claim 1, further comprising:
   forming a source contact on the source region; and
   forming a drain contact on the drain region.

6. The method of claim 1, wherein the semiconductor material is the same material as the semiconductor substrate.

7. The method of claim 1, wherein the semiconductor substrate is silicon and the semiconductor material is a combination of silicon and germanium.

8. The method of claim 1, further comprising:
   forming a channel region in the raised semiconductor region by using the dielectric spacer to block the dopants for the source and drain from entering the channel region, the dielectric spacer causing the channel, source and drain regions to be self aligned with each other by the dielectric spacer acting as a mask.

9. The method of claim 8, wherein the gate electrode has a sidewall that extends vertically above the channel region.

10. A method, comprising:
    forming a raised semiconductor region above a semiconductor substrate;
    forming a first gate dielectric on a first sidewall of the raised semiconductor region;
    forming a first gate electrode having a sidewall abutting the first gate dielectric, the sidewall of the gate electrode being separated from the first sidewall of the raised semiconductor region by the first gate dielectric, the first gate dielectric being positioned between the sidewall of the first gate electrode and the raised semiconductor region;
    forming a dielectric spacer on a top surface of the raised semiconductor region; and
    forming source and drain regions in the raised semiconductor region by implanting dopants into the raised semiconductor region using the dielectric spacer as a mask, wherein a channel region is formed in the raised semiconductor region below the dielectric spacer and is self-aligned with the dielectric spacer, wherein forming the raised semiconductor region includes:
       forming a first dielectric layer overlying the semiconductor substrate;
       removing a section of the first dielectric layer to create an open slot in the first dielectric layer extending in a first direction;
       epitaxially growing a semiconductor material in the slot from the semiconductor substrate, the semiconductor material extending in the first direction;
       forming a second dielectric layer overlying both the first dielectric layer and the semiconductor material;
       removing a portion of the first dielectric layer, the second dielectric layer and the semiconductor material using a single mask to leave the raised semiconductor region of the semiconductor material and a first dielectric material region of the first dielectric layer with the second dielectric layer overlying the raised semiconductor region and first dielectric material region.

11. The method of claim 10, wherein forming epitaxially growing the semiconductor material includes epitaxially growing the semiconductor material using the same material as the semiconductor substrate.

12. The method of claim 10, wherein forming the dielectric spacer on the top surface of the raised semiconductor region includes:

depositing a layer of dielectric spacer material overlying the first gate electrode and the semiconductor material; and etching the dielectric spacer material with an anisotropic etch to remove the dielectric spacer material overlying the semiconductor material and retain a spacer layer adjacent to a sidewall of the first gate dielectric.

13. The method of claim 10, wherein forming the gate electrode includes:

forming a portion of the first gate electrode above a top surface of the semiconductor material, the first dielectric spacer abutting the portion of the first gate electrode.

14. A method, comprising:

forming a raised semiconductor region above a semiconductor substrate;

forming a first gate dielectric on a first sidewall of the raised semiconductor region;

forming a first gate electrode having a sidewall abutting the first gate dielectric, the sidewall of the gate electrode being separated from the first sidewall of the raised semiconductor region by the first gate dielectric, the first gate dielectric being positioned between the sidewall of the first gate electrode and the raised semiconductor region;

forming a dielectric spacer on a top surface of the raised semiconductor region;

forming source and drain regions in the raised semiconductor region by implanting dopants into the raised semiconductor region using the dielectric spacer as a mask, wherein a channel region is formed in the raised semiconductor region below the dielectric spacer and is self-aligned with the dielectric spacer;

forming a second gate dielectric on a second sidewall of the raised semiconductor region; and forming a second gate electrode having a sidewall separated from the second sidewall of the raised semiconductor region by the second gate dielectric, the second gate dielectric being positioned on the sidewall of the second gate electrode.

15. The method of claim 14, further comprising:

forming a layer of dielectric material between the sidewall of the second gate electrode and the source region.

16. The method of claim 14, wherein forming the raised semiconductor region includes:

forming a dielectric layer overlying the semiconductor substrate;

removing a section of the dielectric layer to create an open slot in the dielectric layer extending in a first direction;

epitaxially growing a semiconductor material in the slot from the semiconductor substrate, the semiconductor material extending in the first direction;

removing a portion of the dielectric layer and the semiconductor material using a single mask to leave the raised semiconductor region of the semiconductor material and a dielectric material region of the dielectric layer abutting each other.

17. The method of claim 16, wherein the semiconductor substrate is silicon and the semiconductor material is a combination of silicon and germanium.

18. The method of claim 14, further comprising:

forming a source contact on the source region; and forming a drain contact on the drain region.

19. The method of claim 10, wherein the semiconductor substrate is silicon and the semiconductor material is a combination of silicon and germanium.

20. The method of claim 10, further comprising:

forming a source contact on the source region; and forming a drain contact on the drain region.

* * * * *